United States Patent
Marinero

(10) Patent No.: US 8,193,455 B2
(45) Date of Patent: Jun. 5, 2012

(54) GRAPHENE ELECTRONICS FABRICATION

(75) Inventor: Ernesto E. Marinero, Saratoga, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 621 days.

(21) Appl. No.: 12/345,760

(22) Filed: Dec. 30, 2008

(65) Prior Publication Data
US 2010/0163285 A1 Jul. 1, 2010

(51) Int. Cl.
*E21B 10/64* (2006.01)
*E21B 10/66* (2006.01)

(52) U.S. Cl. ........ 174/257; 174/255; 174/260; 174/261; 977/712; 977/720; 977/721

(58) Field of Classification Search .................. None
See application file for complete search history.

(56) References Cited

U.S. PATENT DOCUMENTS

| | | | |
|---|---|---|---|
| 6,465,813 B2 | 10/2002 | Ihm | 257/183 |
| 7,015,142 B2 | 3/2006 | DeHeer et al. | 438/689 |
| 2005/0127334 A1 | 6/2005 | Shibata et al. | 252/502 |
| 2006/0065887 A1 | 3/2006 | Tiano et al. | 257/20 |
| 2006/0205105 A1 | 9/2006 | Maruyama et al. | 438/50 |
| 2007/0292601 A1 | 12/2007 | Nuckolls et al. | 427/58 |
| 2008/0012047 A1 | 1/2008 | Bertin et al. | 257/213 |
| 2008/0312088 A1 | 12/2008 | Chung et al. | |
| 2009/0218563 A1* | 9/2009 | Gurney et al. | 257/24 |

FOREIGN PATENT DOCUMENTS

| | | |
|---|---|---|
| DE | 102006048537 | 4/2008 |
| JP | 2007335532 | 12/2007 |
| WO | WO 02/063693 | 8/2002 |
| WO | WO 2006/057833 | 6/2006 |

OTHER PUBLICATIONS

Novoselov, K.S., et al., Electric Field Effect in Atomically Thin Carbon Films, Science, vol. 306, pp. 666-669, Oct. 22, 2004.*
Oostinga et al., "Gate-Induced Insulating State in Bilayer Graphene Devices" Nature Publishing Group, vol. 7, Feb. 2008.
deHeer et al., "Epitaxial Graphene" www.elsevier.com/locate/ssc.
Dragoman et al., "Giant Thermoelectric Effect in Graphene" Applied Physics Letters 91, 203116 (2007).
Guttinger et al., "Coulomb Oscillations in three-Layer Graphene Nanostructures" arXiv:0806.1384v1 [cond-mat.mes-hall] Jun. 9, 2008.
Echtermeyer et al., "Graphene Field-Effect Devices" The European Physical Journal Special Topics 148, 19-26 (2007).
Westervelt, R.M., "Graphene Nanoelectronics" www.sciencemag.org Apr. 18, 2008 vol. 320.

* cited by examiner

*Primary Examiner* — Ishwarbhai B. Patel
*Assistant Examiner* — Dion Ferguson
(74) *Attorney, Agent, or Firm* — Zilka-Kotab, PC

(57) ABSTRACT

An electrical circuit structure employing graphene as a charge carrier transport layer. The structure includes a plurality of graphene layers. Electrical contact is made with one of the layer of the plurality of graphene layers, so that charge carriers travel only through that one layer. By constructing the active graphene layer within or on a plurality of graphene layers, the active graphene layer maintains the necessary planarity and crystalline integrity to ensure that the high charge carrier mobility properties of the active graphene layer remain intact.

10 Claims, 22 Drawing Sheets

GRAPHENE ELECTRONICS FABRICATION

FIELD OF THE INVENTION

The present invention relates generally nano-scale electronic circuits and more particularly to a nano-circuit employing a graphene layer supported on multilayer graphene structure.

BACKGROUND OF THE INVENTION

In the push for ever smaller microelectronic devices, researchers have constantly sought to reduce the size of charge carriers in such devices. The ultimate miniaturization of devices is achieved when charge carriers reach the atomic scale. One material of interest for use in reducing the size of such devices is graphene.

Graphene is a single atomic sheet of graphitic carbon atoms that are arranged into a honeycomb lattice. It can be viewed as a giant two-dimensional Fullerene molecule, an unrolled single wall carbon nanotube, or simply a single layer of lamellar graphite crystal. Electron mobility values as high as 200,000 cm$^2$/Vs at room temperature have been measured (Morozov et al, PRL 10, 016602, 2008) making this material extremely attractive for microelectronic applications. However, the transport properties of graphene are very sensitive to modifications of its electronic structure brought about by adsorbates, defects and impurities in the crystal lattice. The challenges of constructing a device using graphene in a manner that can maintain its excellent transport properties are so great that no practical device has been produced using graphene. Therefore, the vast potential of this material has yet to be fully realized.

SUMMARY OF THE INVENTION

The present invention provides an electrical circuit structure employing graphene as a charge carrier transport layer. The structure includes a plurality of graphene layers. Electrical contact is made with one of the layer of the plurality of graphene layers, so that charge carriers travel only through that one layer. By constructing the active graphene layer within or on a plurality of graphene layers, the active graphene layer maintains the necessary planarity and crystalline integrity to ensure that the high charge carrier mobility properties of the active graphene layer remain intact.

The active graphene layer can be formed at the top of a previously formed stack of graphene layers, with the active layer of graphene extending beyond the underlying stack of graphene. The active layer of graphene can then make contact with electrical contact lead in this extended region.

Alternatively, the active graphene layer can be at the bottom of or within a stack of graphene layers, with the active graphene layer extending beyond the above layers within the stack. The active layer can be made to extend beyond the other, above layers by a masking and etching process, and contact with electrically conductive lead layers can be made with the active layer in this region where it extends beyond the above layers.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

The present invention provides the ability to construct an electronic device, such as an electronic circuit in the nano-scale regime. The invention utilizes graphene as a transport carrier for charge carriers in the circuit. Graphene is a single atomic sheet of graphitic carbon atoms that are arranged into a honeycomb lattice. It can be viewed as a two-dimensional Fullerene molecule, an unrolled single wall carbon nanotube, or simply a single layer of lamellar graphite crystal. Electron mobility values as high as 200,000 cm$^2$/Vs at room temperature have been measured. Such results have been described by (Morozov et al, PRL 100, 016602, 2008). Such extremely high electron mobility values make this material extremely attractive for use in microelectronic applications.

Unfortunately, the transport properties of graphene are very sensitive to modifications of its electronic structure such as those brought about by adsorbates, defects and impurities in the crystal lattice. This has prevented the use of graphene in any practical microelectronic applications.

High resolution imaging of graphene structures as formed on common substrates, such as Si wafer substrates reveal that suspended graphene sheets are not perfectly flat, but actually exhibit intrinsic microscopic roughening such that the surface normally varies by several degrees and out-of-plane deformations reach 1 nm. This results in greatly reduced electron transport. Ripples in the graphene layer result in electron pools forming, which severely reduce the practicality of such a graphene sheet in a functioning electronic device.

The present invention allows for the formation of a planar, high integrity graphene layer that can be used in a practical manner in a microelectronic device. This is achieved by forming the graphene layer of interest within a graphene multilayer structure. That is, a series of graphene layers is formed and electrical connection with one of the layers within that series is used to transport charge carriers through that contacted layer.

Therefore, a fabrication process is disclosed for constructing an electronic device employing a single layer graphene sheet formed within a plurality of graphene layers. One challenge in constructing such a graphene-based device is the need to isolate a graphene monolayer. Furthermore, a rigid support for the single layer is required. Prior art means for supporting the single layer graphene sheet have invariably led to deterioration of transport properties due to modification of the electronic properties of the graphene sheet as a result of interface effects.

Figure 1:
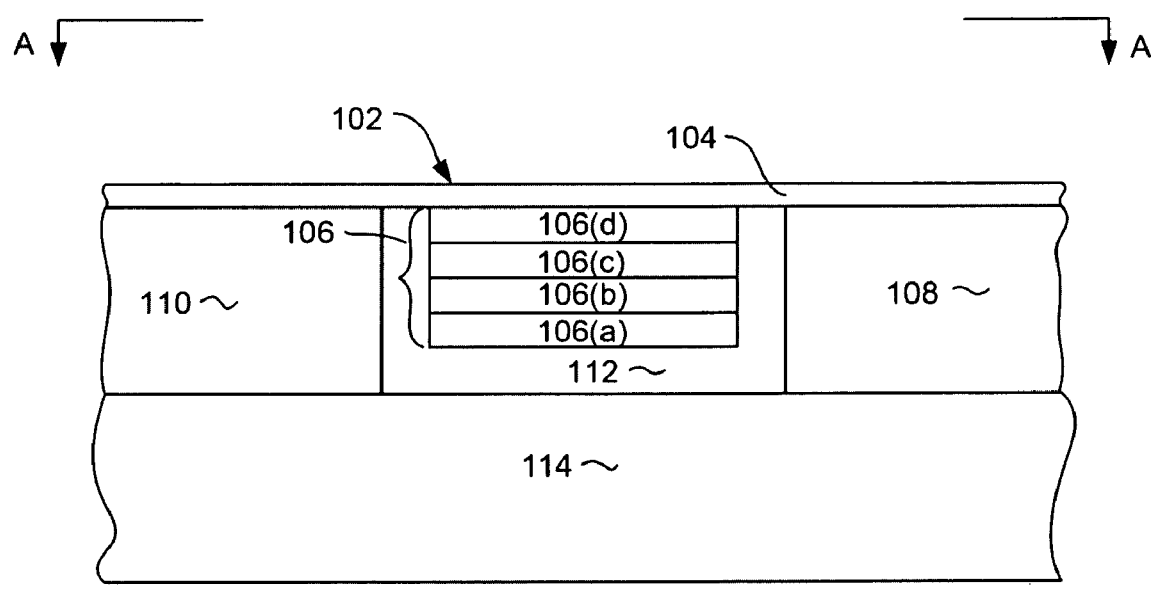
FIG. 1 is a cross sectional schematic view of a graphene based circuit structure according to an embodiment of the invention.

With reference to FIG. 1, a graphene based circuit structure 102 is shown wherein an active, charge transport layer of graphene 104 is supported on a series of multiple graphene layers 106. The active graphene layer is electrically connected with electrically conductive lead layers 108, 110, which can be constructed of various electrically conductive materials, such as, for example, Au or Cu.

The series of graphene layers 106 includes several individual layers 106(a)-106(d), which can be formed directly on top of one another. The number of individual layers 106(a)-106(d) can vary as dictated by design and manufacturing requirements. As can be seen, the series of graphene layers 106 is surrounded at the sides and bottom by an electrically insulating layer 112, which can be an oxide such as alumina or could be some other electrically insulating material. The structure 102 can be formed on a substrate 114 such as a Si wafer or some other suitable substrate.

The series of graphene layers provide an optimal surface for the active graphene layer 102, ensuring optimal charge transport properties. For example, the series of graphene layers 106 provide an extremely flat surface for supporting the active graphene layer, preventing the formation of charge pools, and preventing angular deflections (away from normal) that can otherwise greatly reduce charge carrier transport. In addition, the graphene layers, being of the same material and structure as the active layer 102, prevent inter-diffusion at the boundary between the active graphene layer 104 and series of graphene layers 106.

Graphene has the unique and useful property that charge carriers flowing through the graphene layer 104 do so in a two dimensional plane along the plane of the layer. As a result, the charge carriers passing through the active layer 104 do not travel into an underlying layer 106(d) of the supporting series of graphene layers 106. As mentioned above, the charge carriers travelling through the active graphene layer 104 have extremely high mobility values, as high as 200,000 cm$^2$/Vs at room temperature.

The circuit structure shown in FIG. 1, is for purposes of illustration and example only. In an actual circuit structure, the active graphene layer 104 could have any desired configuration (for example when viewed from a top-down view as from line A-A). Furthermore, the active graphene layer 104 could be used to electrically interconnect any of many various electronic devices, such as solid state amplifiers, switches, capacitors, resistors, inductors, sensors or many other various electronic devices.

Figure 2:
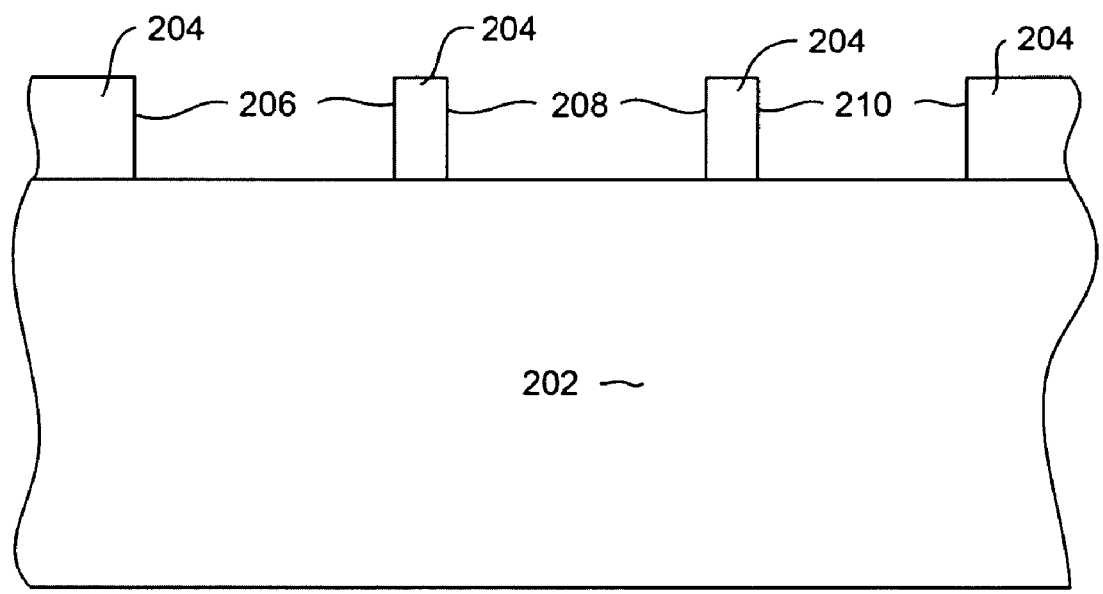
FIGS. 2-9 are cross sectional views of a circuit structure in various intermediate stages of manufacture, illustrating a method for manufacturing a graphene based circuit structure according to an embodiment of the invention.

With reference now to FIGS. 2-9 a method for manufacturing a graphene based circuit structure according to an embodiment of the invention is described. With particular reference to FIG. 2, a substrate 202 is provided. This substrate could be a semiconductor wafer such as a Si wafer, or could be some other material. A first mask structure 204, such as a photolithographically patterned photoresist layer is formed over the substrate. The first mask structure 204 can be formed with openings 206, 208, 210 configured to define openings for a multi-layer graphene support structure and a contact pad location as will be described herein below.

Figure 3:
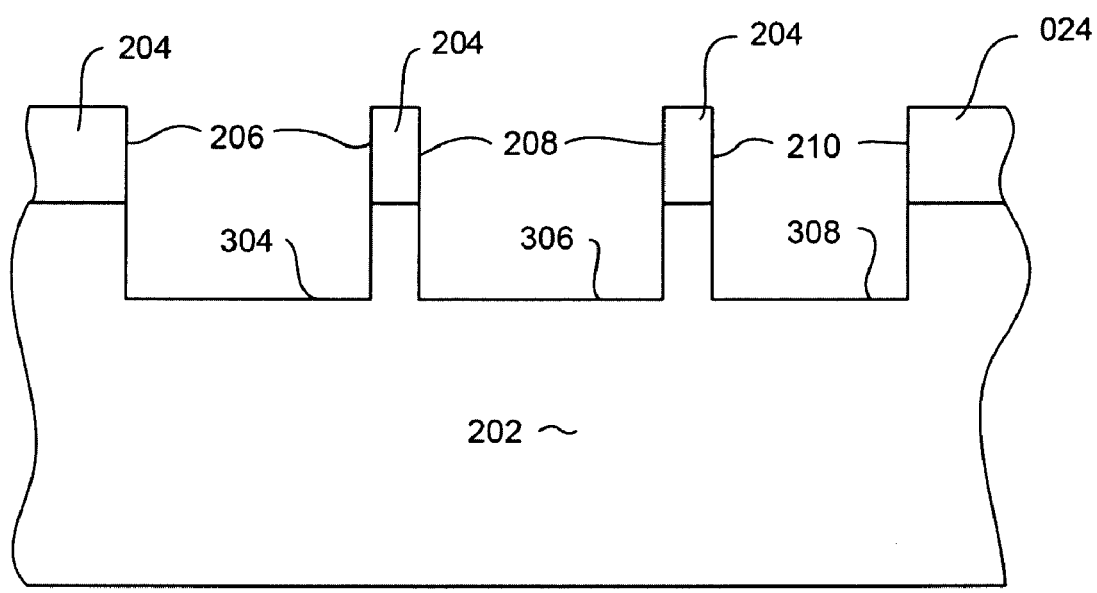

With reference to FIG. 3, a material removal process such as reactive ion etching or ion milling can be used to remove a portion of the substrate material from regions not covered by the mask 204 (ie. portions exposed by the openings 206, 208, 210 in the mask 204) to form wells 304, 306, 308. The inner well 306 will define a multi-layer graphene support, and the outer wells 304, 308 will be used to form electrical contact pads as will be clearer below.

Figure 4:
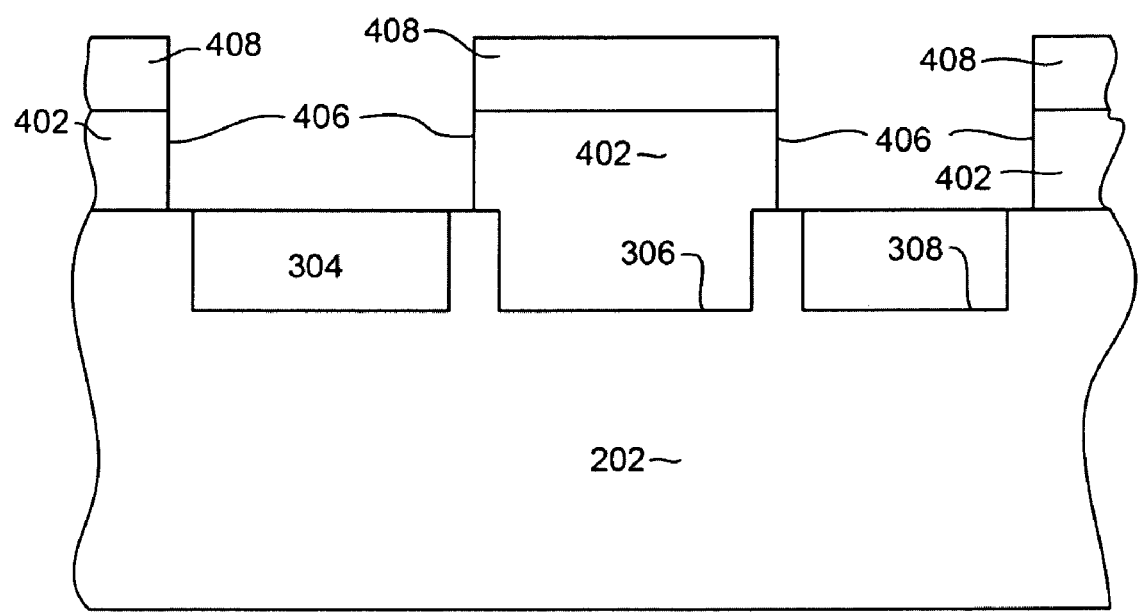
Figure 5:
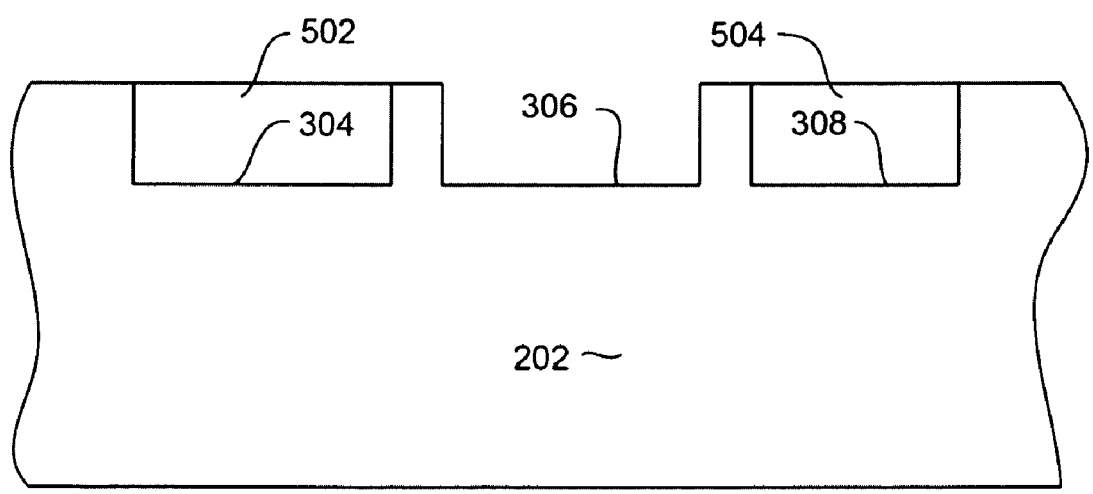

Then, with reference to FIG. 4, a second mask structure 402 can be formed over the substrate 202. This second mask structure 402 can be formed to cover the inner well 306, and to have openings 404, 406 over the outer wells 304, 308 (contact pad wells). An electrically conductive contact material 408 such as Au, Cu or some other material can then be deposited over the mask 402 and into the wells 304, 308. The mask 402 can then be lifted off, such as by soaking in a hot NMP solution, leaving a structure such as that shown in FIG. 5, with contact pads 502, 504 formed by the electrically conductive material 408 deposited in FIG. 4. A chemical mechanical polishing process can optionally be performed to planarize the surface of the electrically conductive contact pads 502, 504 and substrate 202.

Figure 6:
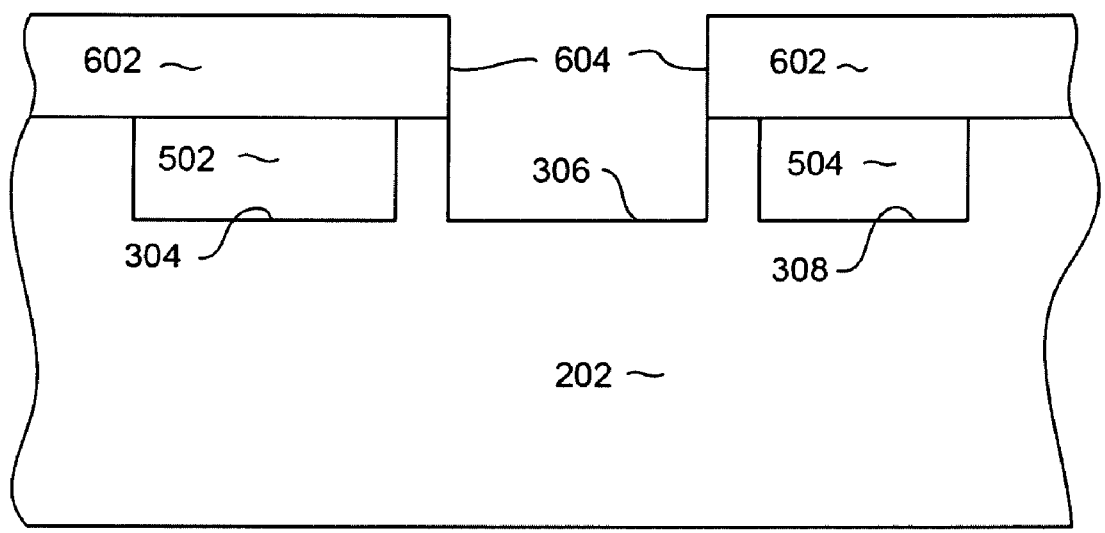
Figure 7:
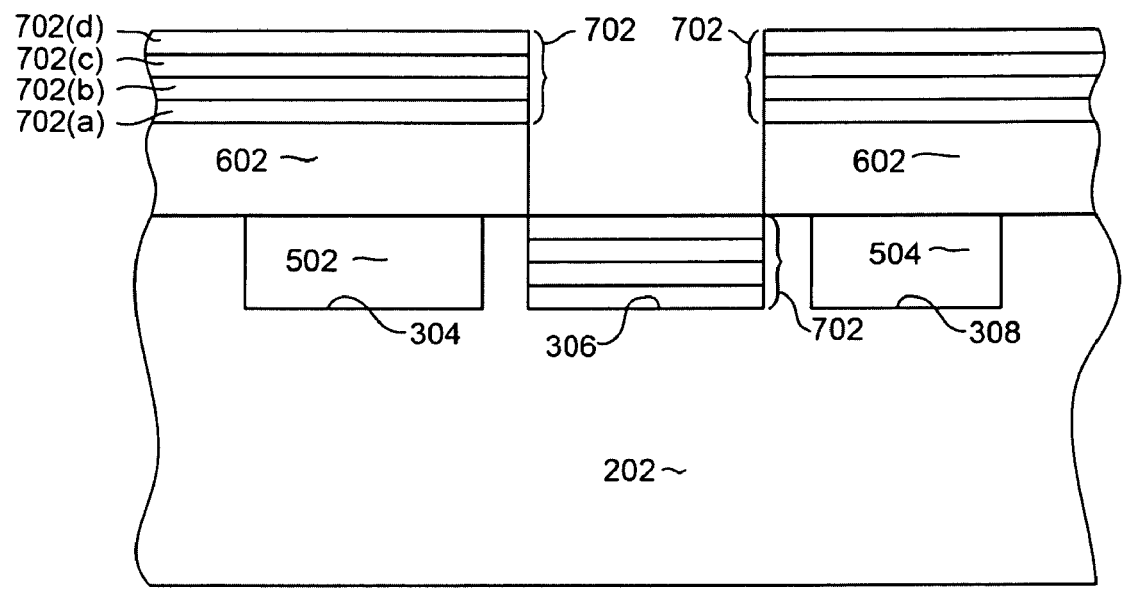
Figure 8:
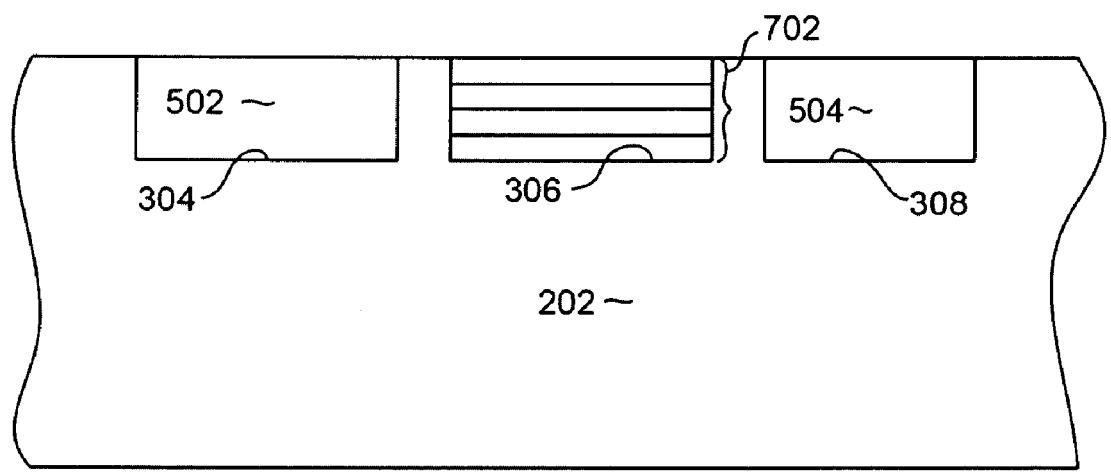

With reference to FIG. 6, a third mask structure 602 can be formed. As with the previous masks 204, 402, the third mask 602 can be formed of a photolithographically patterned photoresist. The third mask 602 can be formed to cover the contact pads 502, 504 and to have an opening 604 configured to expose the inner well 306. Then, with reference to FIG. 7, a series of graphene layers 702 are formed. The number of individual layers formed can depend on design factors, such as how many are necessary to ensure a flat surface of the uppermost layer. For purposes of illustration, 4 individual graphene layers 702(a)-702(d) are shown in FIG. 7. Then, the mask 602 can be lifted off, leaving the structure shown in FIG. 8.

Figure 9:
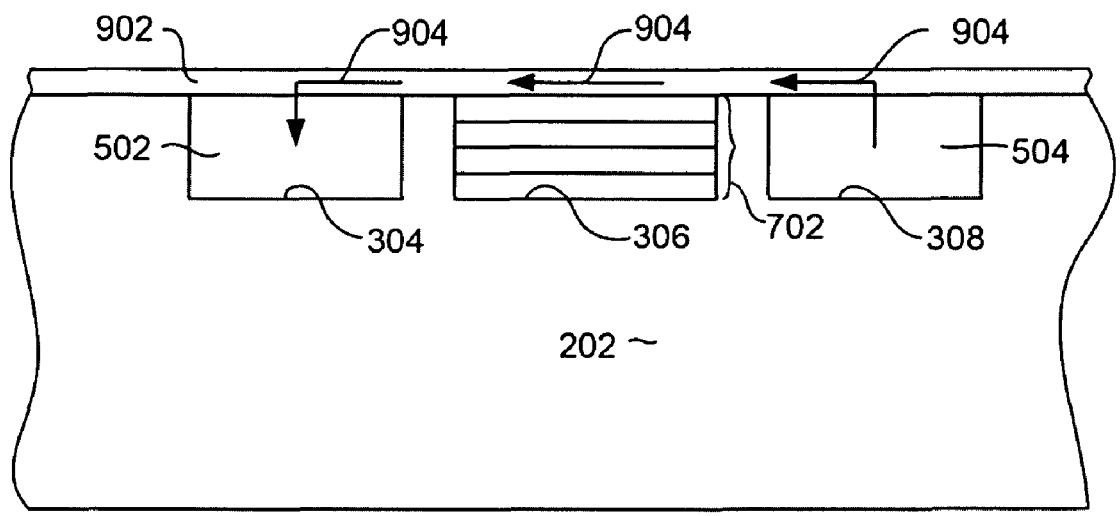

With reference now to FIG. 9, a single layer of graphene 902 can be formed over the substrate 202, contact pads 502, 504 and series of graphene layers 702 (which form a support for the single graphene layer 902). The single graphene layer 902 provides an active graphene layer for the transport of charge carriers therethrough. By applying voltage potential between the contact pads 504, 502, charge carriers such as electrons can travel through the single atomic mono-layer graphene sheet 902 as indicated by line 904.

Figure 10:
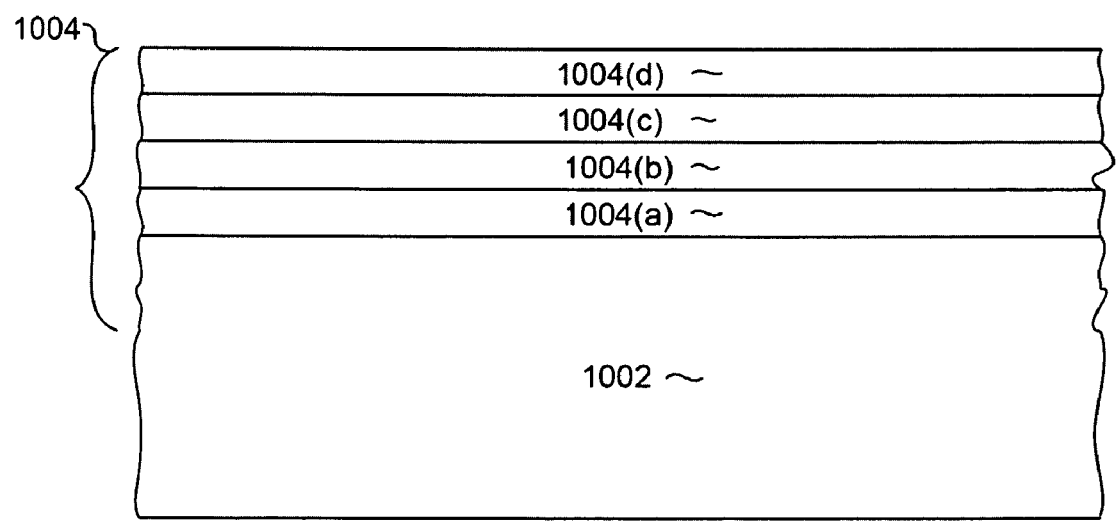
FIGS. 10-18 are cross sectional views of a circuit structure in various intermediate stages of manufacture, illustrating a method for manufacturing a graphene based circuit structure according to an embodiment of the invention.

FIGS. 10-18 illustrate a method for manufacturing a graphene based circuit structure according to another possible embodiment of the invention. With reference to FIG. 10, a substrate 1002 is provided. As with the above described embodiment, the substrate 1002 can be a semiconductor substrates such as Si wafer or some other suitable material. A series 1004 of graphene layers 1004(a)-1004(d) is formed over the substrate 1002. The number of individual graphene layers in the series 1004 is a matter of design choice.

Figure 11:
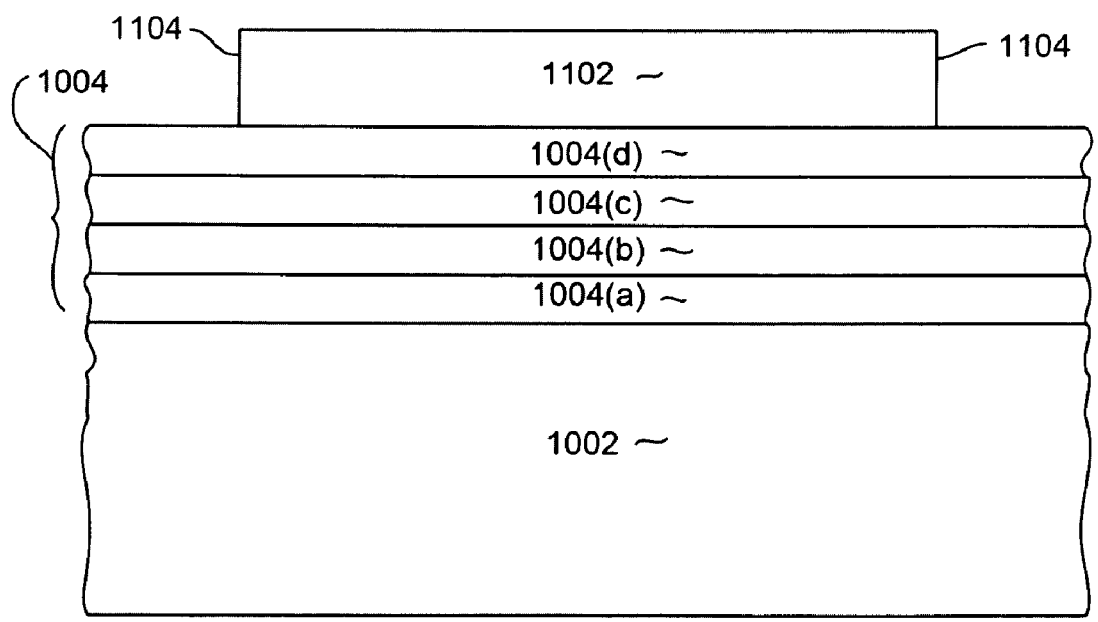
Figure 12:
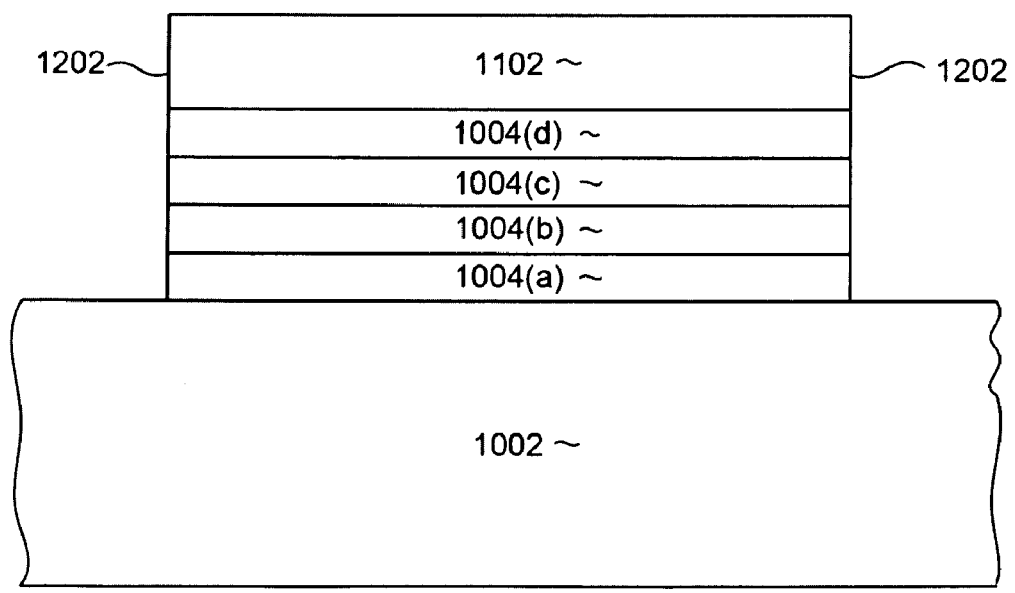

Then, with reference to FIG. 11, a first mask 1102 such as a photolithographically patterned photoresist mask 1102 is formed over the layers 1102. The first mask 1102 has outer edges 1104 located so as to define an outer edge of the circuit device. A first material removal process such as ion milling or reactive ion etching can then be performed to remove a portion of the series of graphene layers 1004 that are not protected by the first mask. This first material removal process can be performed until the substrate 1002 has been reached.

Figure 13:
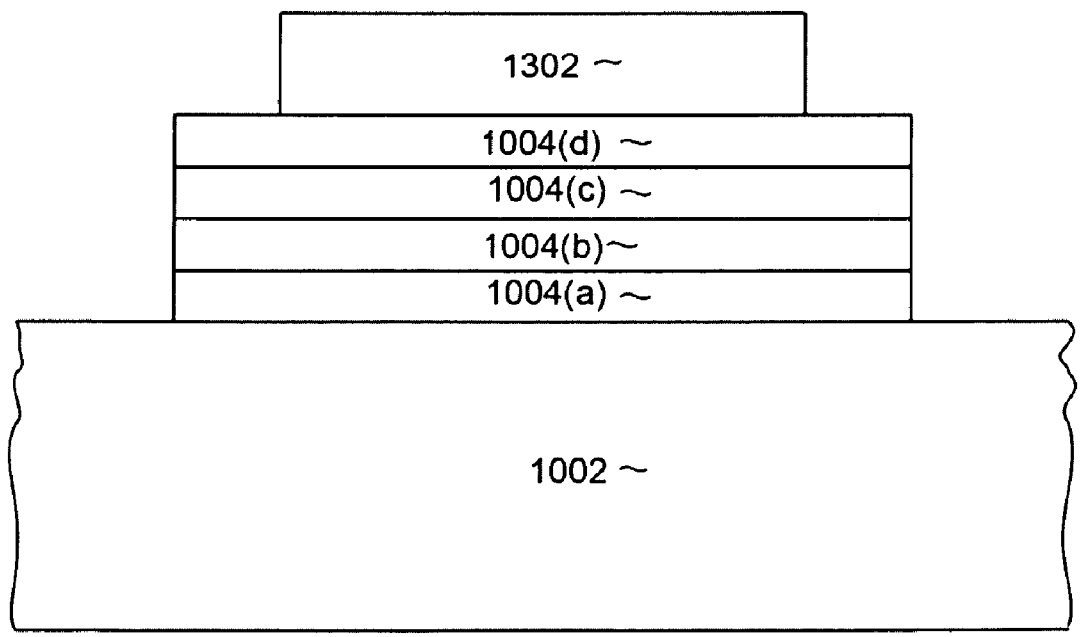
Figure 14:
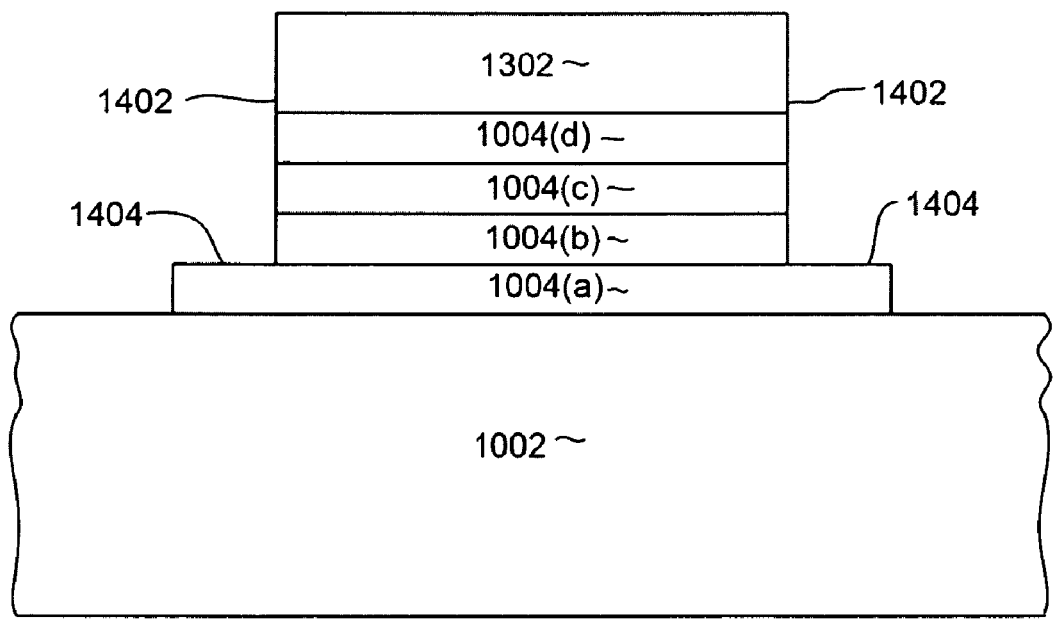

Then with reference to FIG. 13, a second mask structure 1302 is formed having outer edges 1304 that are slightly inward from those of the first mask structure 1102. Then, a second material removal process such as reactive ion etching is performed, removing portions of the layers 1202 that are not protected by the second mask structure. This second material removal process is, however, terminated before the bottom graphene layer 1004(a) has been removed, resulting in a structure such as that shown in FIG. 14, wherein the bottom graphene layer 1004(a) extends slightly beyond the edges 1402 of the other layers. This forms electrical contact tabs 1404, as will be better understood below.

End point detection of the single layer of graphene 1004(a) can be implemented by in-situ Raman scattering-based techniques or by monitoring the reflectivity changes of the graphene as the etching proceeds. If end-point detection in the nanoscale is needed, the method known as Tip-enhanced Raman Spectroscopy can be employed. In this, the tip of an Atomic Force Microscope (AFM) is coated with a metal to induce plasmon resonances at the apex. This has been shown to be an effective method to conduct Raman spectroscopy with spatial resolution of about 20 nm and, therefore, could be employed as an end-point methodology for generating single layer graphene with nm resolution.

Figure 15:
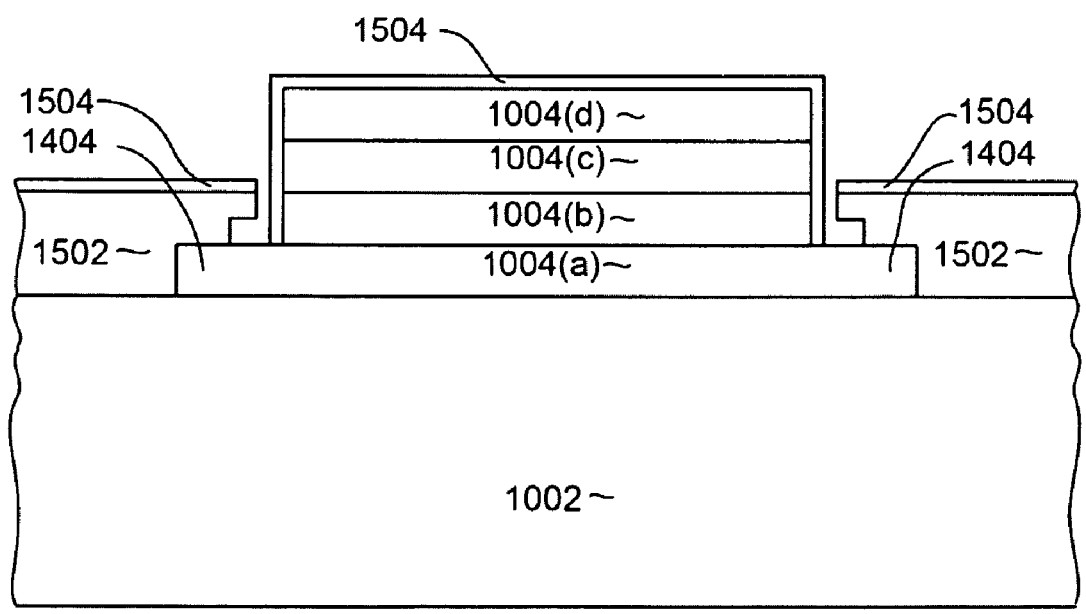
Figure 16:
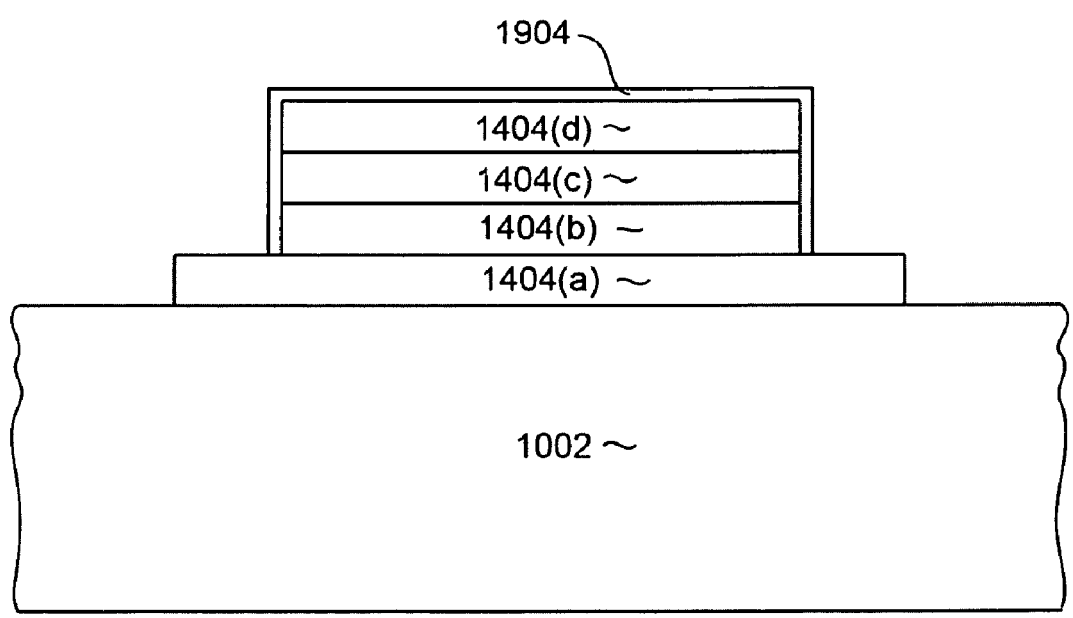

With reference now to FIG. 15, a third mask structure 1502 can be formed, as shown, to just cover the contact tabs 1404 of the first graphene layer while leaving the other graphene layers 1004(b)-1004(d) uncovered. The mask 1502 can be constructed as a bi-layer mask with an overhang, as shown, to facilitate lift-off. A layer of electrically insulating material 1504 such as a thin oxide layer (e.g. alumina) can then be formed, as shown in FIG. 15. The insulation layer 1504 is preferably deposited by a conformal deposition method such as atomic layer deposition or chemical vapor deposition so that it is deposited on the sides 1002 of the layers 1004(b)-(d) as well as on horizontal surfaces. Then, this third mask structure 1502 can be lifted off, resulting in a structure as shown in FIG. 16.

Figure 17:
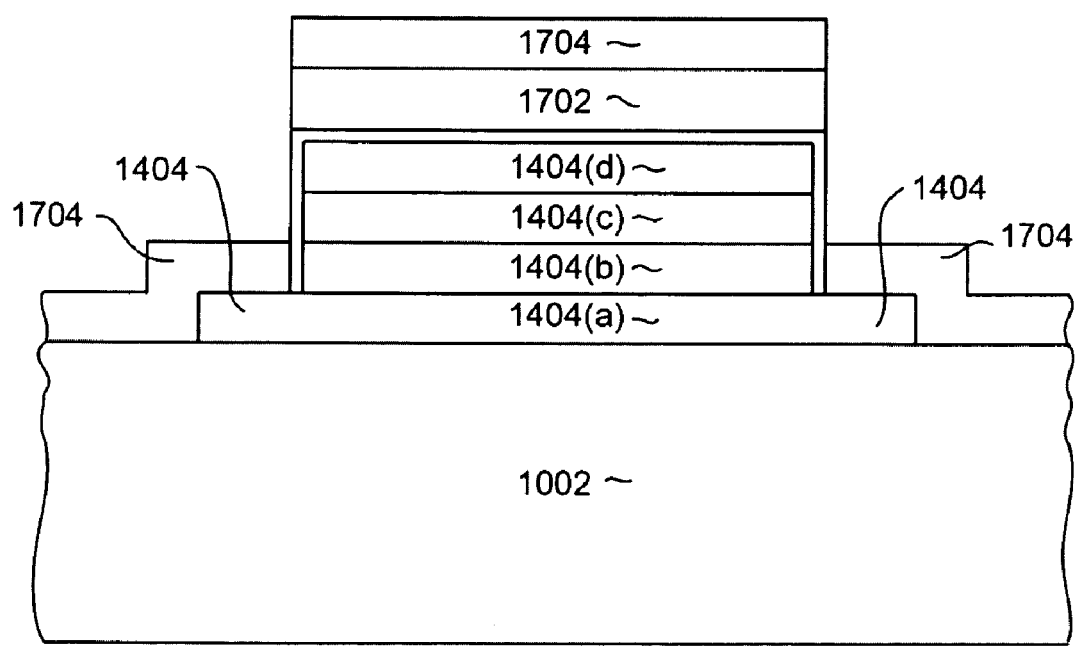
Figure 18:
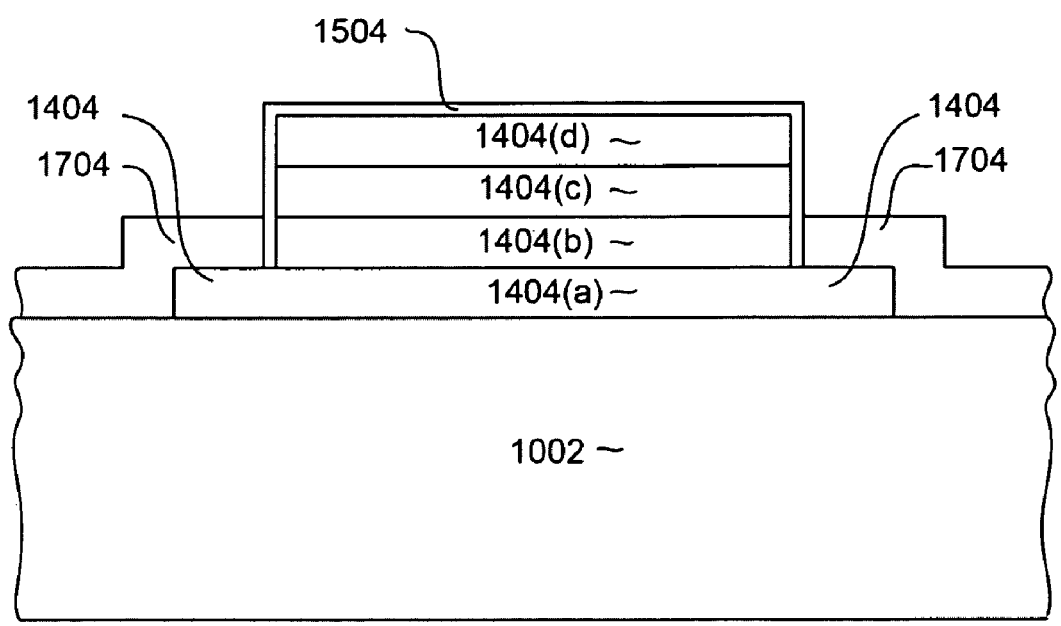

With reference to FIG. 17, an optional fourth mask structure 1702 can be formed to cover just the area over the layers 1004(d) and oxide layer 1504, leaving the contact tabs 1404 uncovered. Then, an electrically conductive lead material 1704 such as Au or Cu can be deposited. This electrically conductive lead material 1704 covers the lead tabs 1402. Then, with reference to FIG. 18, the fourth mask structure 1702 can be lifted off, removing the electrically conductive material 1704 formed over it in the process. Therefore, this fourth mask structure 1702 acts as a release layer for removing unwanted portions of the lead material 1704 from over oxide 1504 and graphene layers 1002(b)-(d), while leaving the lead material 1704 over and contacting the lead tabs 1402.

While the above process discloses the bottom layer 1404(a) as being the active, conducting layer of the structure, this is by way of example only. The active conducting graphene layer could be a layer within the series of graphene layers 1404, such as, for example, layer 1404(c), with electrical contact being made only to that layer (e.g. 1404(c)).

It has been found that a large reduction in signal noise can be achieved by using a bi-layer graphene structure as opposed to a single layer graphene structure. Therefore, in order to reduce signal noise, any of the above structures can be modified so that the charge carriers flow through a bi-layer graphene structure. This affect of using a bi-layer graphene structure has been discussed in a paper entitled, Strong Suppression of Electrical Noise in Bilayer Graphene Nano Devices, by IBM researchers Yu-Ming Lin and Phaedon Avouris, Dates Jan. 29, 2008.

Figure 19:
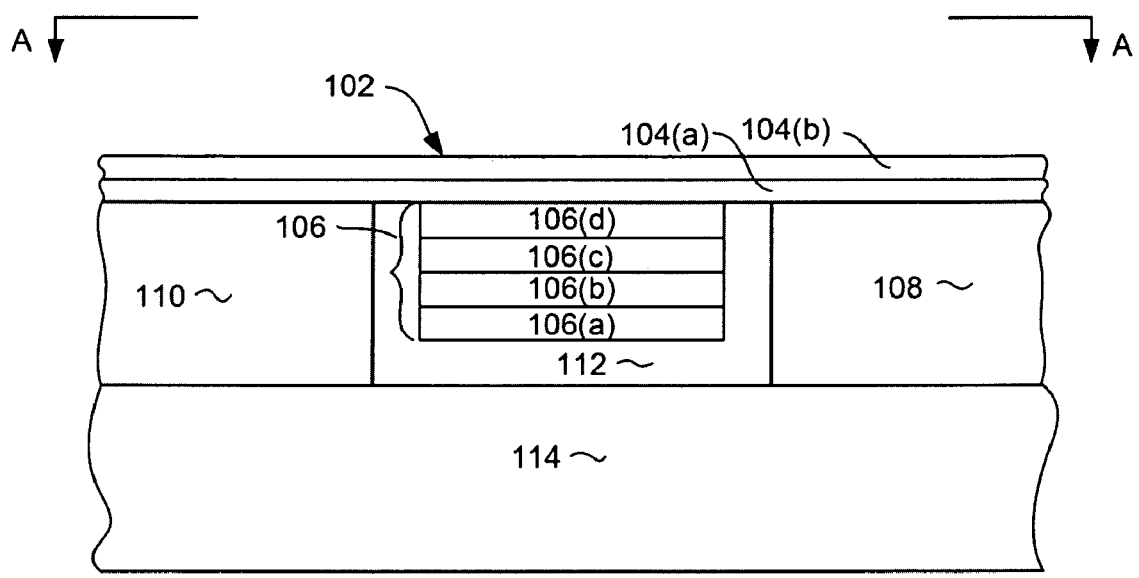
FIG. 19 is an illustration of a structure similar to that of FIG. 1, but using a bi-layer graphene layer for the transport of charge carriers.
Figure 20:
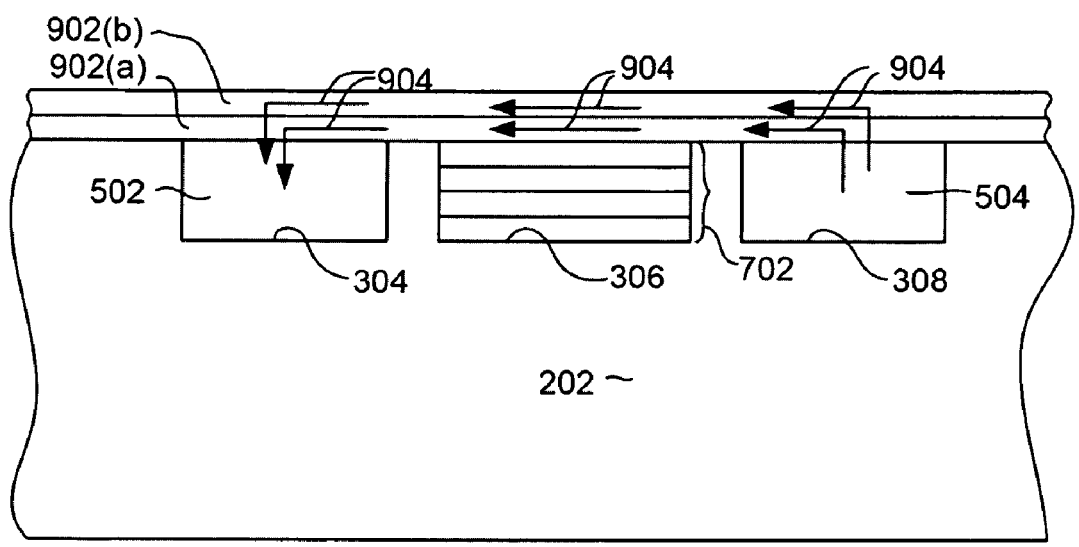
FIG. 20 is an illustration of a structure similar to that of FIG. 9, but using a bi-layer graphene layer for the transport of charge carriers.
Figure 21:
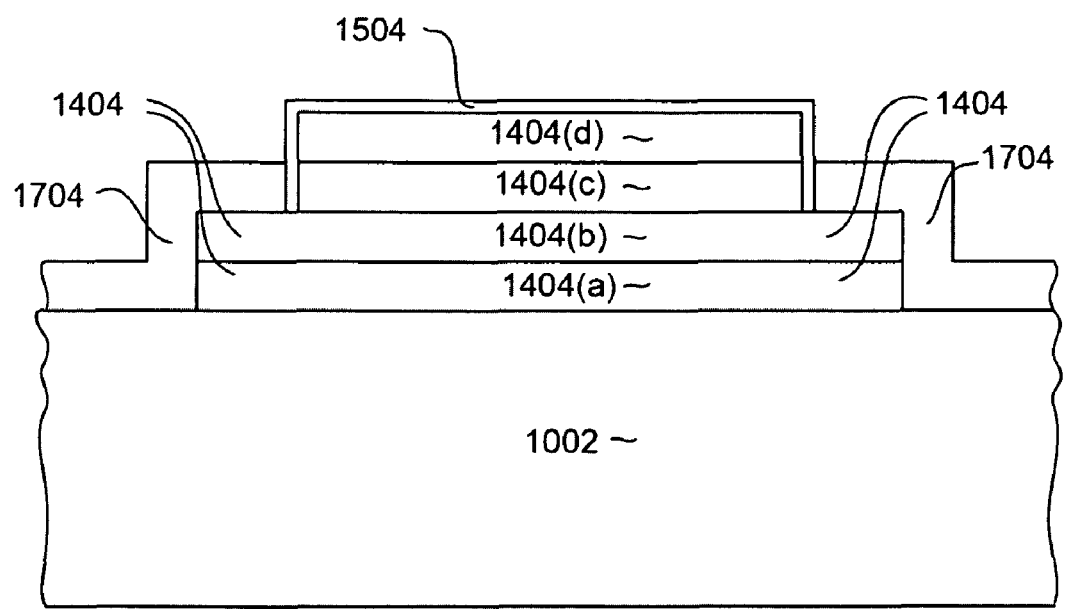
FIG. 21 is an illustration of a structure similar to that of FIG. 18, but using a bi-layer graphene layer for the transport of charge carriers.

For example, FIG. 19 shows a structure similar to that of FIG. 1, except that the charge carriers flow through a bi-layer graphene structure that includes first and second layers of graphene 102(a) and 102(b). Similarly, FIG. 20 shows a structure similar to that of FIG. 9, except that the charge carriers 904 travel through both layers of a bi-layer graphene structure that includes layers 902(a) and 902(b). FIG. 21 shows a structure similar to FIG. 18, except that charge carriers flow through two graphene layers 1404(a) and 1404(b) rather than just a single graphene layer.

Figure 22:
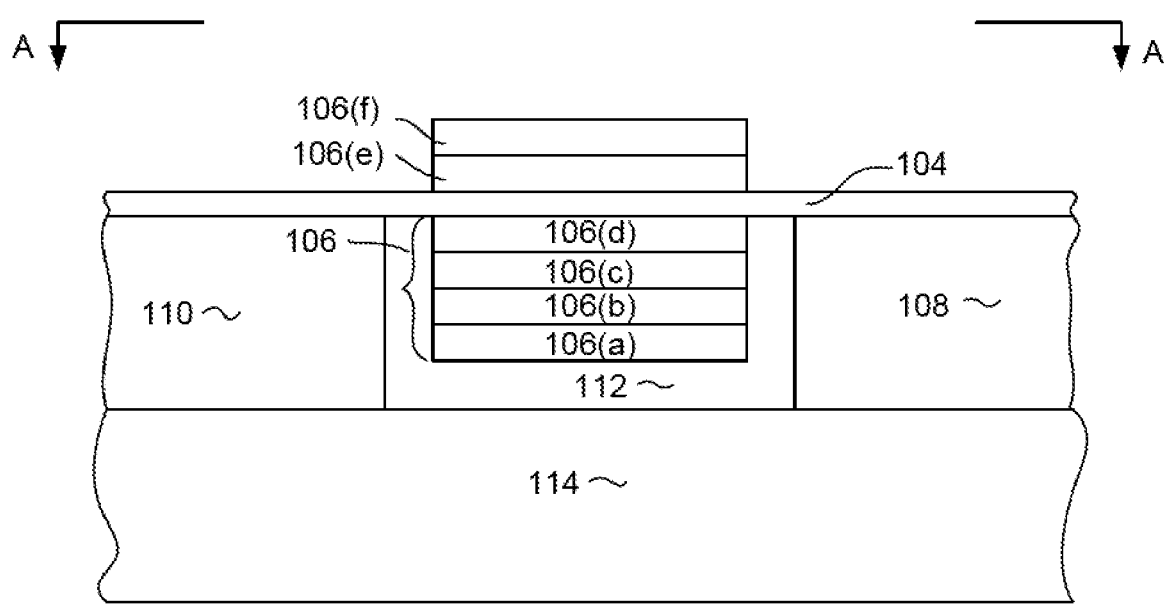
FIG. 22 is an illustration of another embodiment of the invention.

FIG. 22 shows another possible embodiment of the invention, including multiple layers of graphene 106(a-f) and wherein the active graphene layer (single graphene layer 104 is sandwiched between adjacent graphene layers 106(d), 106(e).

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A circuit structure comprising:
a plurality of layers of graphene formed one on another; and
first and second electrical contacts, both of the first and second electrical contacts being electrically connected with a single graphene layer of the plurality of layers of graphene, wherein at least a portion of the plurality of graphene layers have first and second edges that define first and second sides, and wherein the single layer of graphene extends beyond the first and second sides.

2. The circuit structure as in claim 1 wherein the single graphene layer is at the top of the plurality of graphene layers.

3. The circuit structure as in claim 1 wherein the single graphene layer is at the bottom of the plurality of graphene layers.

4. The circuit structure as in claim 1 wherein the single graphene layer within the plurality of graphene layers is sandwiched between adjacent graphene layers.

5. The circuit structure as in claim 1 wherein the plurality of graphene layers includes at least three layers of graphene.

6. The circuit structure as in claim 1 wherein the plurality of graphene layers is formed on a substrate.

7. The circuit structure as in claim 1 wherein the plurality of graphene layers is formed on a Si substrate.

8. The circuit structure as in claim 1 wherein the single graphene layer makes contact with the first and second electrical contacts in a region beyond the first and second sides.

9. The circuit structure as in claim 1 further comprising an electrically insulating layer formed on the first and second sides.

10. The circuit structure as in claim 8 further comprising an electrically insulating material formed between each of the first and second sides and an adjacent one of the electrical contacts.

* * * * *